(12) United States Patent
Balakrishnan et al.

(10) Patent No.: US 8,207,455 B2
(45) Date of Patent: Jun. 26, 2012

(54) POWER SEMICONDUCTOR PACKAGE WITH BOTTOM SURFACE PROTRUSIONS

(75) Inventors: Balu Balakrishnan, Saratoga, CA (US); Brad L. Hawthorne, Saratoga, CA (US); Stefan Bäurle, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 320 days.

(21) Appl. No.: 12/462,245

(22) Filed: Jul. 31, 2009

(65) Prior Publication Data

US 2011/0024185 A1    Feb. 3, 2011

(51) Int. Cl.
H01L 23/48    (2006.01)

(52) U.S. Cl. .................... 174/528; 174/138 G (58) Field of Classification Search ............. 174/138 G, 174/521, 528, 532, 533
See application file for complete search history.

(56) References Cited

U.S. PATENT DOCUMENTS

| | | | |
|---|---|---|---|
| 3,590,348 A * | 6/1971 | Bertics | 361/308.1 |
| 4,339,785 A * | 7/1982 | Ohsawa | 361/779 |
| 4,573,105 A * | 2/1986 | Beldavs | 361/768 |
| 4,769,685 A | 9/1988 | MacIver et al. | |
| 4,833,570 A * | 5/1989 | Teratani | 361/770 |
| 4,875,151 A | 10/1989 | Ellsworth et al. | |
| 5,008,794 A | 4/1991 | Leman | |
| 5,072,268 A | 12/1991 | Rumennik et al. | |
| 5,155,904 A * | 10/1992 | Majd | 29/837 |
| 5,164,891 A | 11/1992 | Keller | |
| 5,258,636 A | 11/1993 | Rumennik et al. | |
| 5,274,259 A | 12/1993 | Grabowski et al. | |
| 5,285,367 A | 2/1994 | Keller | |
| 5,313,082 A | 5/1994 | Eklund | |
| 5,323,044 A | 6/1994 | Rumennik et al. | |
| 5,411,901 A | 5/1995 | Grabowski et al. | |
| 5,423,119 A * | 6/1995 | Yang | 29/841 |
| 5,489,752 A * | 2/1996 | Cognetti et al. | 174/266 |
| 5,672,910 A | 9/1997 | Majumdar et al. | |
| 5,684,677 A * | 11/1997 | Uchida et al. | 361/770 |
| 5,726,861 A * | 3/1998 | Ostrem | 361/767 |
| 5,751,556 A * | 5/1998 | Butler et al. | 361/773 |
| 5,886,876 A * | 3/1999 | Yamaguchi | 361/767 |
| 6,084,277 A | 7/2000 | Disney et al. | |
| 6,168,983 B1 | 1/2001 | Rumennik et al. | |
| 6,207,994 B1 | 3/2001 | Rumennik et al. | |
| 6,281,579 B1 | 8/2001 | Siu | |
| 6,424,007 B1 | 7/2002 | Disney | |

(Continued)

OTHER PUBLICATIONS

"2-phase Switched Reluctance Motor Drives"Byoungchul Cho, Sungil Yong, Motion Control System Group, Fairchild Semiconductor, Korea. Bodo's Power Systems, Sep. 2007. pp. 28-29.

(Continued)

*Primary Examiner* — Hung Ngo
(74) *Attorney, Agent, or Firm* — The Law Offices of Bradley J. Bereznak (57) ABSTRACT

A package includes a body that encapsulates a semiconductor die, the body having a first pair of opposing lateral sides, a second pair of opposing lateral sides, a top, and a bottom. The bottom has a primary surface and a plurality of protrusions that extend outward from the primary surface. When the package is mounted to a printed circuit board (PCB) the protrusions contact the PCB and the primary surface is disposed a first distance away from the PCB. The package further includes a plurality of leads that extend outward from the first pair of opposing lateral sides.

8 Claims, 7 Drawing Sheets

U.S. PATENT DOCUMENTS

| | | | |
|---|---|---|---|
| 6,465,291 B1 | 10/2002 | Disney | |
| 6,468,847 B1 | 10/2002 | Disney | |
| 6,489,190 B2 | 12/2002 | Disney | |
| 6,501,130 B2 | 12/2002 | Disney | |
| 6,504,209 B2 | 1/2003 | Disney | |
| 6,509,220 B2 | 1/2003 | Disney | |
| 6,552,597 B1 | 4/2003 | Disney et al. | |
| 6,555,873 B2 | 4/2003 | Disney et al. | |
| 6,555,883 B1 | 4/2003 | Disney et al. | |
| 6,563,171 B2 | 5/2003 | Disney | |
| 6,570,219 B1 | 5/2003 | Rumennik et al. | |
| 6,573,558 B2 | 6/2003 | Disney | |
| 6,583,663 B1 | 6/2003 | Disney et al. | |
| 6,603,197 B1 | 8/2003 | Yoshida et al. | |
| 6,633,065 B2 | 10/2003 | Rumennik et al. | |
| 6,635,544 B2 | 10/2003 | Disney | |
| 6,639,277 B2 | 10/2003 | Rumennik et al. | |
| 6,667,213 B2 | 12/2003 | Disney | |
| 6,680,646 B2 | 1/2004 | Disney | |
| 6,683,344 B2 | 1/2004 | Tsukanov et al. | |
| 6,724,041 B2 | 4/2004 | Rumennik et al. | |
| 6,730,585 B2 | 5/2004 | Disney | |
| 6,734,714 B2 | 5/2004 | Disney | |
| 6,750,105 B2 | 6/2004 | Disney et al. | |
| 6,759,289 B2 | 7/2004 | Disney | |
| 6,768,171 B2 | 7/2004 | Disney | |
| 6,768,172 B2 | 7/2004 | Rumennik et al. | |
| 6,777,749 B2 | 8/2004 | Rumennik et al. | |
| 6,781,198 B2 | 8/2004 | Disney | |
| 6,787,437 B2 | 9/2004 | Rumennik et al. | |
| 6,787,847 B2 | 9/2004 | Disney et al. | |
| 6,798,020 B2 | 9/2004 | Disney et al. | |
| 6,800,903 B2 | 10/2004 | Rumennik et al. | |
| 6,815,293 B2 | 11/2004 | Disney et al. | |
| 6,818,490 B2 | 11/2004 | Disney | |
| 6,825,536 B2 | 11/2004 | Disney | |
| 6,828,631 B2 | 12/2004 | Rumennik et al. | |
| 6,838,346 B2 | 1/2005 | Disney | |
| 6,865,093 B2 | 3/2005 | Disney | |
| 6,882,005 B2 | 4/2005 | Disney et al. | |
| 6,979,781 B2 * | 12/2005 | Aoki | 174/541 |
| 6,987,299 B2 | 1/2006 | Disney et al. | |
| 7,115,958 B2 | 10/2006 | Disney et al. | |
| 7,135,748 B2 | 11/2006 | Balakrishnan | |
| 7,220,629 B2 | 5/2007 | Balakrishnan | |
| 7,221,011 B2 | 5/2007 | Banerjee et al. | |
| 7,253,042 B2 | 8/2007 | Disney et al. | |
| 7,253,059 B2 | 8/2007 | Balakrishnan | |
| 7,335,944 B2 | 2/2008 | Banerjee | |
| 7,381,618 B2 | 6/2008 | Disney | |
| 7,391,088 B2 | 6/2008 | Balakrishnan | |
| 7,459,366 B2 | 12/2008 | Banrjee | |
| 7,468,536 B2 | 12/2008 | Parthasarathy | |
| 7,494,875 B2 | 2/2009 | Disney | |
| 7,557,406 B2 | 7/2009 | Parthasarathy | |
| 7,585,719 B2 | 9/2009 | Balakrishnan | |
| 7,595,523 B2 | 9/2009 | Parthasarathy et al. | |
| 7,872,875 B2 * | 1/2011 | So et al. | 361/770 |
| 7,875,962 B2 | 1/2011 | Balakrishnan et al. | |
| 2004/0089928 A1 | 5/2004 | Nakajima et al. | |
| 2005/0051352 A1 * | 3/2005 | Aoki | 174/52.1 |
| 2005/0067178 A1 * | 3/2005 | Pearson et al. | 174/52.4 |
| 2005/0167749 A1 | 8/2005 | Disney | |
| 2007/0205503 A1 | 9/2007 | Baek et al. | |

OTHER PUBLICATIONS

"Plastic Dual In-Line (PDIP) Packages", product data sheet. AMKOR Technology. Jul. 2003.

FAN2106—TinyBuck 6A, 24V Input Integrated Synchronous Buck Regulator. Fairchild Semiconductor Corporation. Jul. 2007.

STMicroelectronics Group of Companies, BU808DFH, High Voltage Fast-Switching NPN Power Darlington Transistor, Apr. 2002.

* cited by examiner (Prior Art)

POWER SEMICONDUCTOR PACKAGE WITH BOTTOM SURFACE PROTRUSIONS

TECHNICAL FIELD

This disclosure relates generally to the field of packaging of power semiconductor devices.

BACKGROUND

Figure 1:
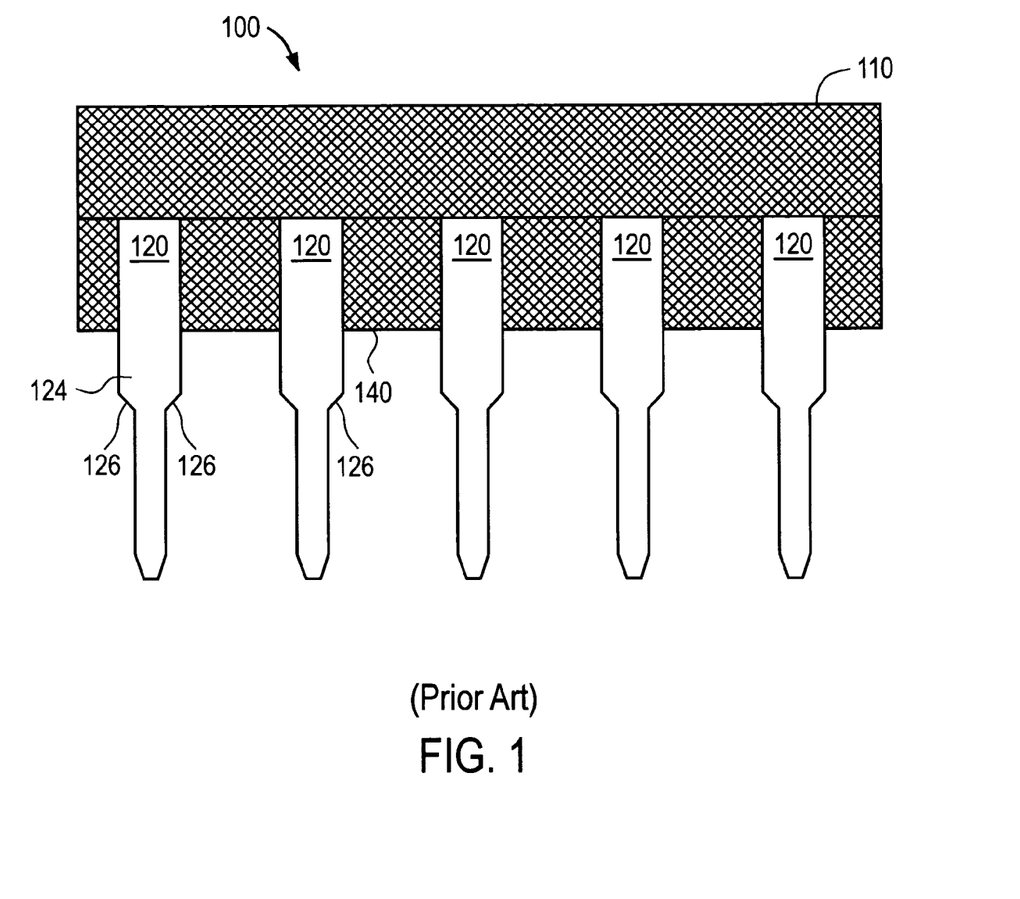
FIG. 1 illustrates a side view of a prior art semiconductor package.

Power semiconductor devices which include high-voltage field-effect transistor (HVFET) devices and other integrated circuits (ICs) that dissipate high power are well known in the semiconductor arts. Such power semiconductor devices are typically encapsulated within a package that is designed for assembly onto a printed circuit board (PCB). FIG. 1 is a side view of a typical prior art semiconductor package 100 that includes a body 110 and a plurality of leads 120 that extend outward from the sides of the body. Each of the leads is wider at the top as compared to the bottom. Where the width of leads 120 transition from the narrower bottom part to the wider top part, shoulders 126 are provided. The shoulders 126 of each of leads 120 typically rest on a top surface of the PCB (not shown) when the package is assembled. This provides a separation distance between a bottom surface 140 of package body 110 and the top surface of the PCB. Although this separation distance is useful when cleaning off the top surface of the PCB, this package design suffers from a number of drawbacks.

One of the drawbacks with the prior art semiconductor package of FIG. 1, is that the increased width at the top of leads 120 increases the overall size of the package. This occurs because leads 120 need to be separated by a minimum distance, referred to as a clearance distance, to meet certain electrical standards. Furthermore, any downward force applied to the top of package body 110 during the initial insertion into the PCB and/or during attachment of a heat sink is transferred to the shoulders of the leads. This can stress the leads and cause bending, breaking, or disconnecting of the leads (and/or lead wires) connected to the semiconductor die housed within the package body. In addition, such downward forces may also stress the package body causing delamination of the internal wiring connected to the semiconductor die within the package body.

BRIEF DESCRIPTION OF THE DRAWINGS

The present disclosure will be understood more fully from the detailed description that follows and from the accompanying drawings, which however, should not be taken to limit the disclosed subject matter to the specific embodiments shown, but are for explanation and understanding only. It should also be understood that the elements in the figures are representational, and are not drawn to scale in the interest of clarity.

DESCRIPTION OF EXAMPLE EMBODIMENTS

In the following description specific details are set forth, such as material types, dimensions, structural features, manufacturing steps, etc., in order to provide a thorough understanding of the disclosure herein. However, persons having ordinary skill in the relevant arts will appreciate that these specific details may not be needed to practice the embodiments described. References throughout this description to "one embodiment", "an embodiment", "one example" or "an example" means that a particular feature, structure or characteristic described in connection with the embodiment or example is included in at least one embodiment. The phrases "in one embodiment", "in an embodiment", "one example" or "an example" in various places throughout this description are not necessarily all referring to the same embodiment or example. Furthermore, the particular features, structures or characteristics may be combined in any suitable combinations and/or sub-combinations in one or more embodiments or examples.

Figure 2:
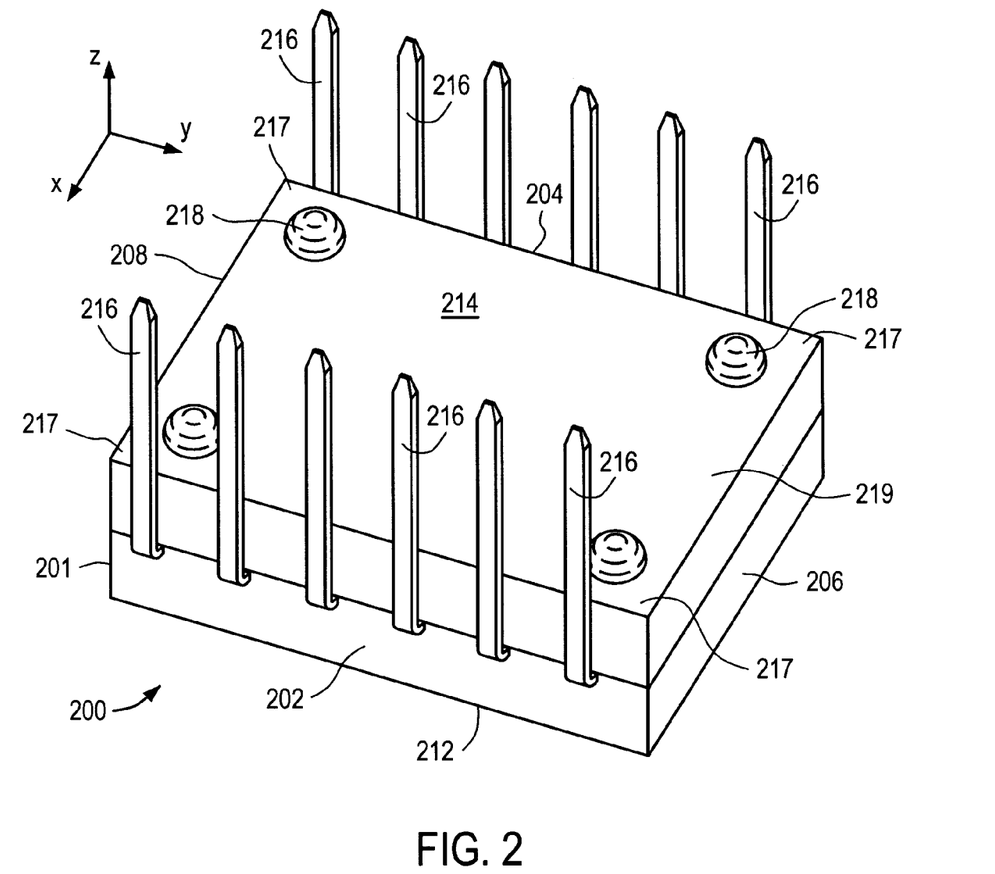
FIG. 2 is a bottom perspective view of an example power semiconductor package.

FIG. 2 is a bottom perspective view of an example power semiconductor package 200 housing a semiconductor device or die (not shown). The semiconductor die may comprise one of any number of different types of power integrated circuits. For example, the semiconductor die encapsulated within package 200 may include a power output device with an integrated controller circuit for a switching power converter, or a high voltage power switch. In another embodiment, package 200 may include a plurality of semiconductor devices or dies.

Package 200 comprises a body 201 made of any one of a number of different types of packaging materials (e.g., plastic molding compound, ceramic, etc.) that is formed into a rectilinear shape. Body 201 encapsulates the semiconductor die and includes opposing lateral sides 202 & 204, respective front and back sides 206 & 208, a top 212, and a bottom 214. Bottom 214 includes a substantially flat, planar bottom surface 219 and a plurality of bumps or protrusions 218 that extend outward from bottom surface 219. In the example of FIG. 2, each of the protrusions 218 is located near a corresponding corner of bottom surface 219.

Package 200 further includes a plurality of metallic leads 216 that extend outward from opposing lateral sides 202 and 204. In the embodiment shown, six leads are shown extending outward from each of opposing lateral sides 202 and 204. Other embodiments may have more or less leads 216 extending out of respective lateral sides 202 and 204. In still other embodiments, additional leads may extend out of front and back sides 206 & 208. In yet another embodiment, leads 216 may extend out of only one side of package 200. Also, an aspect ratio of package 200, represented by the length and width of body 201 in the y and x directions, respectively, may vary in different implementations.

In the example of FIG. 2, opposing lateral sides 202 and 204 each have substantially flat surfaces that are substantially parallel to one another. Adjacent leads 216 are laterally separated or offset from each other by a minimum distance (shown as distance $d_{CLR}$ in FIG. 4) to meet electrical requirements.

For instance, the safety standard document published by the International Electrotechnical Commission, IEC 60950-1, provides general guidelines for clearance distance based on the voltage appearing between conductive parts and the environment in which the package is used.

Continuing with the example of FIG. 2, protrusions 218 are formed integral with body 201. For example, body 201 may be formed using an injection molding process in which substantially non-conductive material is injected into a mold that encapsulates a power semiconductor die. A mold, therefore, is utilized to form the shape, size, location and pattern of protrusions 218 extending outward from bottom surface 219. In another embodiment, protrusions 218 may comprise one or more separate articles formed of the same similar material as body 201. For example, protrusions 218 may comprise a patterned sheet or matrix of material that is adhesively attached to bottom surface 219 during the manufacturing process.

Practitioners in the packaging arts will appreciate that although the example of FIG. 2 shows four protrusions 218, each located in proximity of corners 217 of bottom surface 219, other embodiments may include any number, shape, location and size of protrusions. For example, whereas each of protrusions 218 are shown in FIG. 2 shaped as a round mound (e.g., like a pitcher's mound) or semi-spherical shape. Other embodiments may include protrusions 218 each shaped as a cone, a plateau, a pole, an arch cylindrical, block, pyramidal, etc. Moreover the size, pattern and location of protrusions 218 may vary in different implementations. A1

Figures 3A, 3B:
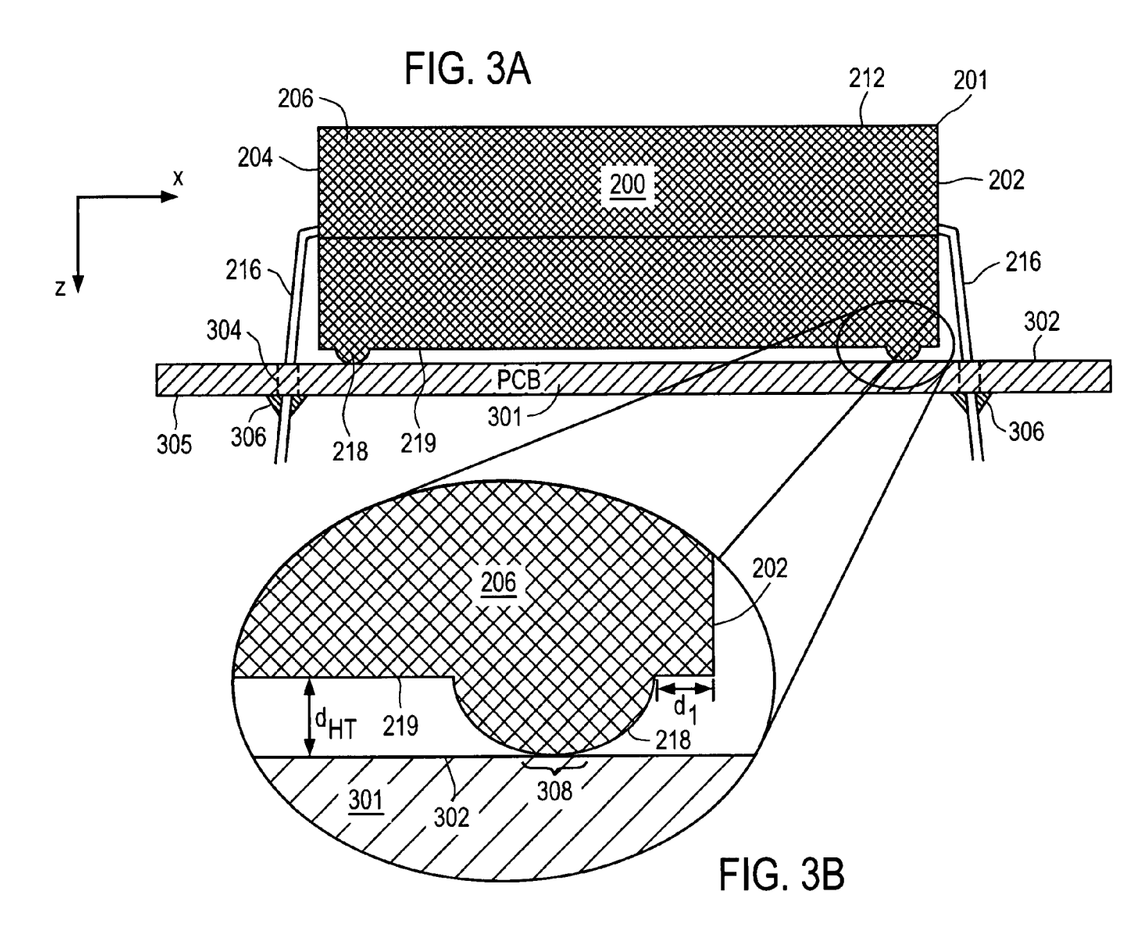
FIG. 3A is a front side view of the power semiconductor package shown in FIG. 2 assembled on a circuit board.
FIG. 3b is an expanded view of a bottom corner section of the assembly shown in FIG. 3A

FIG. 3A illustrates a front side view of semiconductor package 200 shown after assembly onto a printed circuit board (PCB) 301. FIG. 3B is a view of a bottom corner section of the assembly shown in FIG. 3A. Practitioners in the art will appreciate that during the process of mounting or assembling semiconductor package 200 to PCB 301, leads 216 are inserted into through-hole openings 304 of PCB 301 such that a contact area 308 of each protrusion 218 is in contact with an upper surface 302 of PCB 301. An electrical bonding agent or material 306 (e.g., solder) may be utilized to mechanically and/or electrically couple leads 216 to metal traces or lines running along a bottom surface 304 and/or a top surface 302 of PCB 301. In certain installations, a small amount of epoxy or similar adhesive may be applied to the contact area 308 of each protrusion to better secure package 200 to PCB 301.

As clearly shown in FIGS. 3A & 3B, when package 200 is mounted to PCB 301, contact area 308 of each protrusion 218 contacts top surface 302 of PCB 301. For purposes of discussion, contact area 308 is defined as the amount of surface area of a protrusion 218 that is in substantially contact with surface 302 when package 200 is mounted or assembled onto PCB 301. In one embodiment, the total area of all contact areas 308 of protrusions 218 is about 0.7% or less of the total surface area of bottom surface 219. In other embodiments, protrusions 218 may be shaped such that contact area 308 is substantially zero. For example, protrusions 218 may be designed in the shape of a pyramid or cone where only a small tip or point of protrusions 218 contact top surface 302 of PCB 301.

The expanded view of FIG. 3B further shows how protrusions 218 provide a separation distance $d_{HT}$ that separates bottom surface 219 of package 200 from top surface 302 of PCB 301. Essentially, this separation distance $d_{HT}$ is equal to the height of each protrusion 218. That is, in the embodiments shown, protrusions 218 all have substantially the same height $d_{HT}$. In alternative embodiments, protrusions 218 may have variable heights which allow the separation distance $d_{HT}$ to vary from one side of the package to another. Such a varying separation distance still provides sufficient room to clean top surface 302 of PCB 301 with a fluid. In the examples shown in FIGS. 2-5, height $d_{HT}$ is approximately 250 microns.

FIG. 3B also illustrates one of protrusions 218 being offset or disposed by a distance d1 away from an adjacent side edge (e.g., side 202) of body 201. In one embodiment, distance d1 is approximately 300 microns. However, persons of skill in the art will understand that this distance d1 may vary considerably in different implementations. In certain embodiments, protrusions may be formed coincident with the side surfaces of package 200 (i.e., d1=0).

Figure 4:
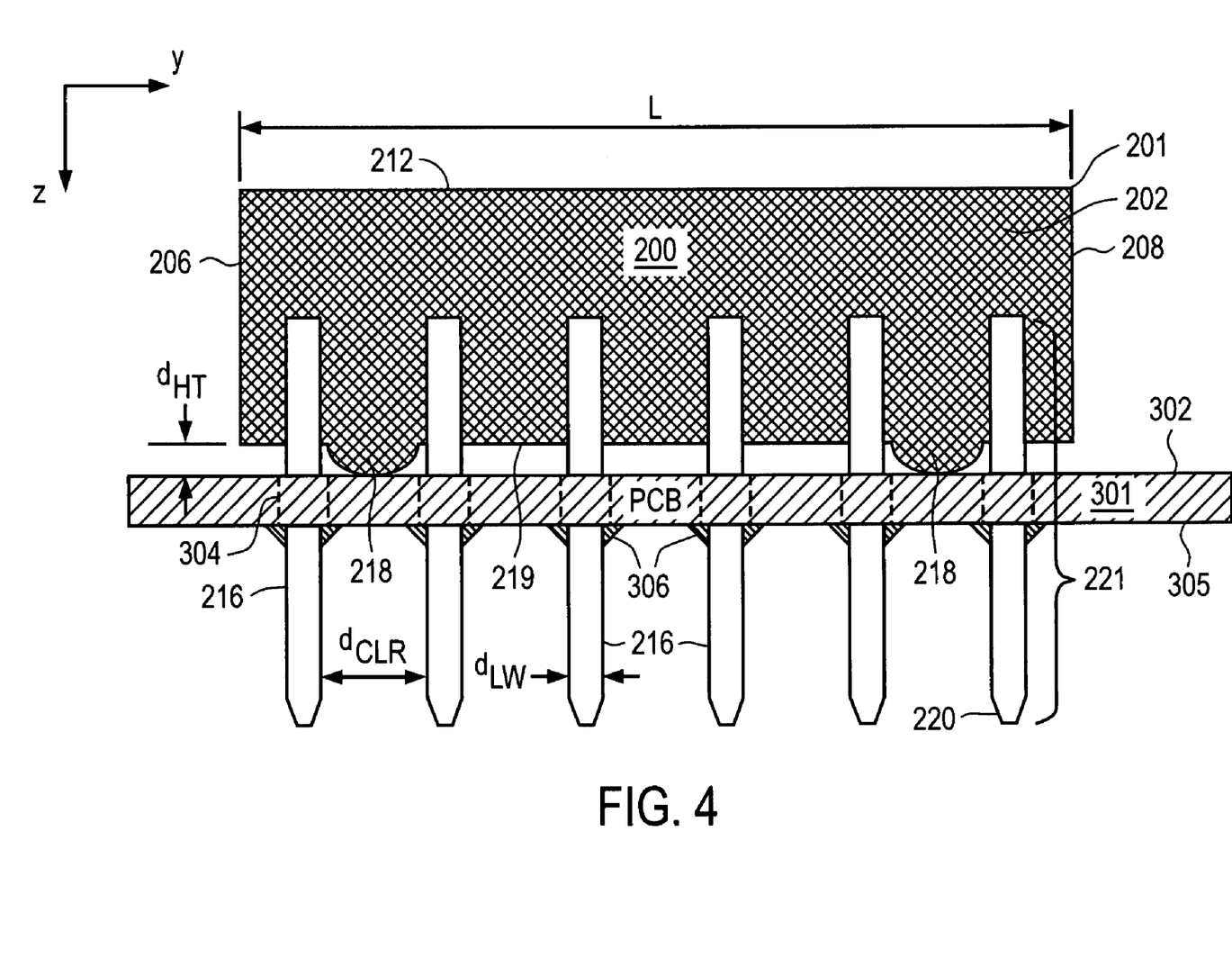
FIG. 4 illustrates a lateral side view of the assembly shown in FIGS. 3A & 3B.

FIG. 4 illustrates a lateral side view of the assembly of FIGS. 3A & 3B, which shows a set of six leads 216 extending outward from side 202 and down through PCB 301 in a substantially symmetrical arrangement. Adjacent leads 216 are laterally separated or offset from each other by a clearance distance $d_{CLR}$ to meet electrical requirements. In one embodiment the clearance distance $d_{CLR}$ may be about 1.27 mm. When package 200 includes a high voltage device, an adequate clearance distance $d_{CLR}$ may be required to prevent a short circuit occurring between two adjacent leads 216 due to a dielectric breakdown caused by the ionization of air. As shown, each of leads 216 has a slightly tapered tip or end 220 and an extended length section 221 that has a substantially constant width $d_{LW}$. Width $d_{LW}$ is substantially narrower as compared to the top section of the leads shown in the prior art design of FIG. 1, which allows the overall length (in the y-direction) of package 200 to be considerably reduced. A smaller package translates to a lower cost package for a given die size. In other words, the inclusion of protrusions 218 disposed on bottom surface 219 permits the lead width $d_{LW}$ to be reduced, which results in a reduction in the overall length L of package 200. In another example, a "creepage" distance, i.e., the distance along the surface of package 200 between two leads 216, may be extended with the same package size and same number of leads 216.

Figure 5:
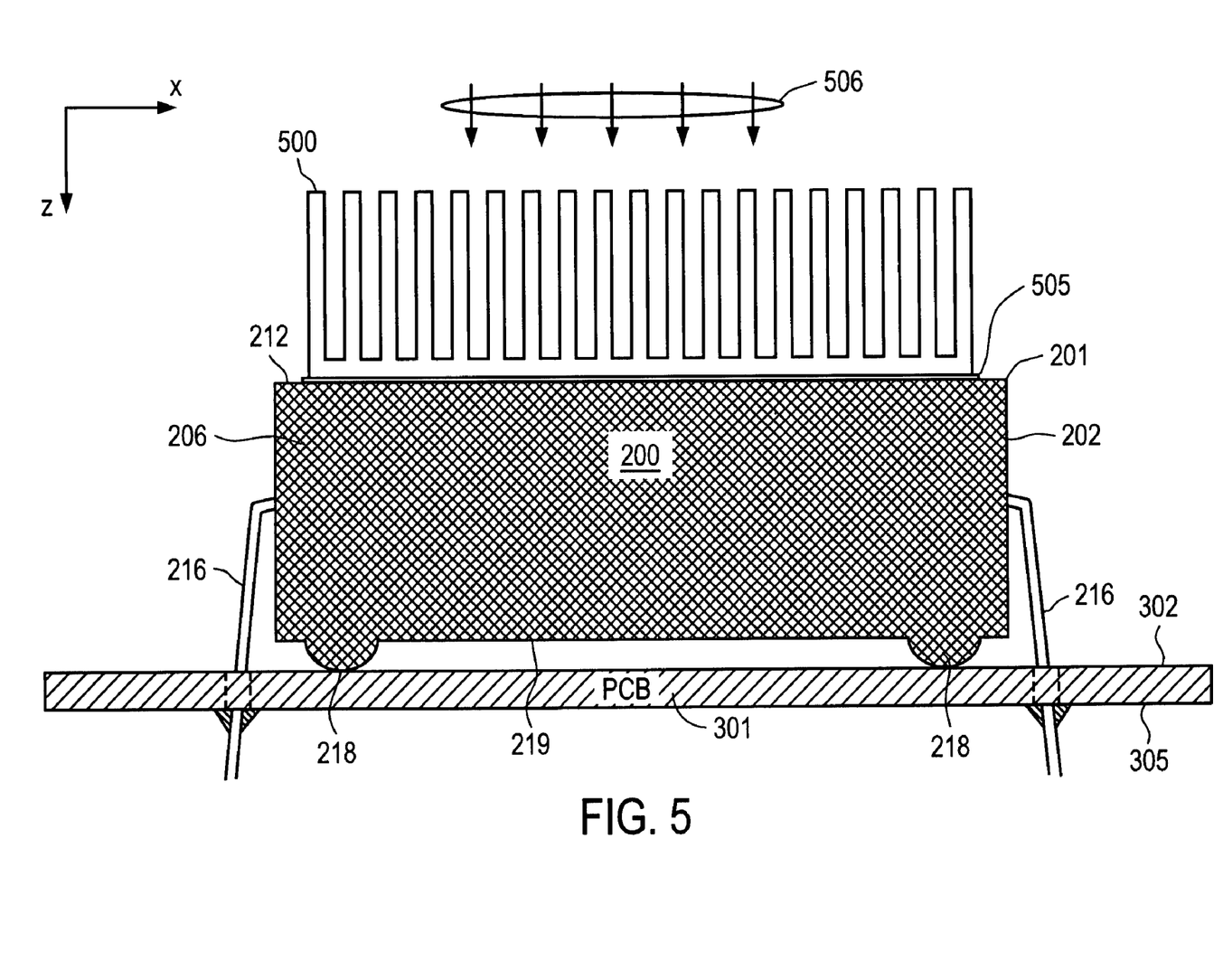
FIG. 5 is a front side view of the assembly of FIGS. 3 & 4 with a heat sink attached to the top of the package.

FIG. 5 is a front side view of the assembly of FIGS. 3 & 4 with a heat sink 500 attached to top 212 of package 200. Heat sink 500 typically comprises a metallic or other thermally conductive material that is attached to top surface 212 of package 200 using ordinary epoxy 505. Alternatively, various types of other adhesives, a spring clip, a screw, and/or other known adhesive or mechanical techniques may be used to mechanically couple heat sink 500 to top surface 212.

During the process of mounting heat sink 500 to package 200, a large, force (represented by arrows 506) may be applied to secure heat sink 500 to top surface 212 of package 200. In another embodiment, force 506 may be a constant force applied to secure heat sink 500 to top surface 212 of package 200. One benefit of the example power semiconductor packages described herein is that the downward force applied to heat sink 500 is substantially transferred through body 201 to protrusions 218. Thus, protrusions 218 on the bottom of package 200 helps prevent mechanical stress from being imparted to leads 216 and solder 306, which are mechanically vulnerable to breakage or to electrically disconnect from the semiconductor device housed inside package 200. It is therefore appreciated that protrusions 218 further improves the robustness and integrity of package 200 when coupled to heat sink 500.

Figure 6:
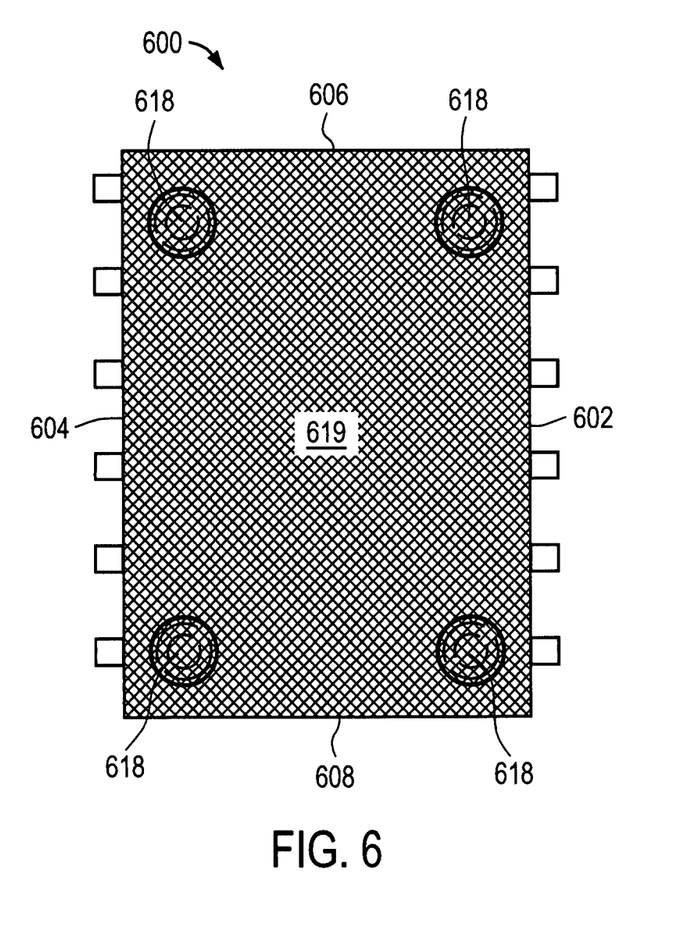
FIG. 6 is a bottom view of the power semiconductor package shown in FIG. 2.
Figure 7:
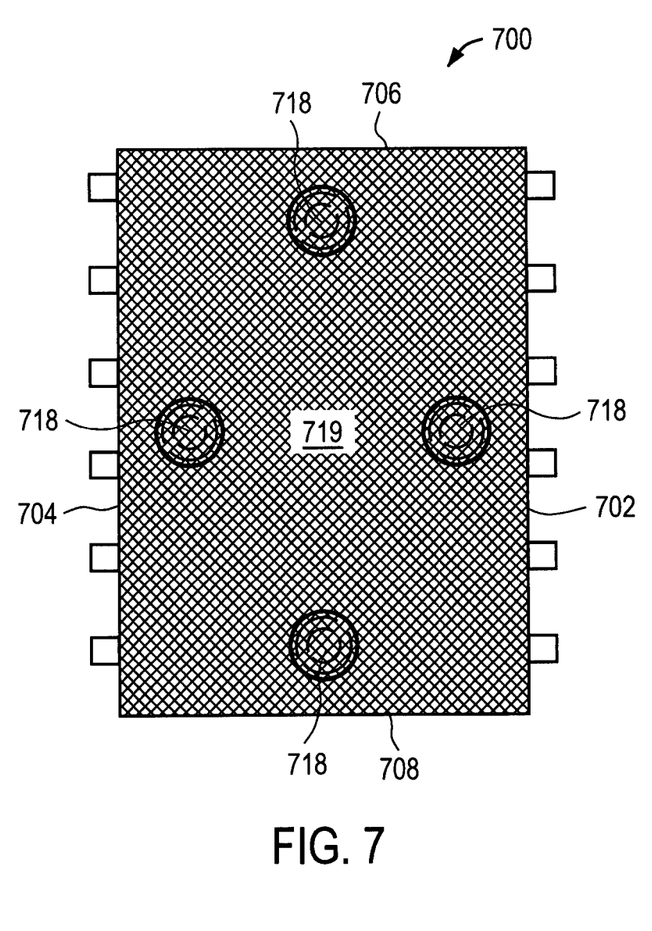
FIG. 7 is a bottom view of another example power semiconductor package.

FIG. 6 is a bottom view of a semiconductor package 600, showing the arrangement of protrusions 618—one near each corner of bottom surface 619. As discussed previously, protrusions 618 may be arranged against or coincident with the edges where bottom surface 619 meets lateral sides 602 & 604 and/or respective front and back sides 606 & 608. Practitioners in the art will appreciate that other alternative arrangements or configurations of protrusions 618 may also be employed. For example, FIG. 7 is a bottom view of another example semiconductor package 700 in which protrusions 718 are arranged on bottom surface 719 such that each of protrusions 718 is disposed at or near the middle of an edge of bottom surface 719 that adjoins a corresponding one of lateral sides 702 & 704 and front and back sides 706 & 708, respectively.

Figure 8:
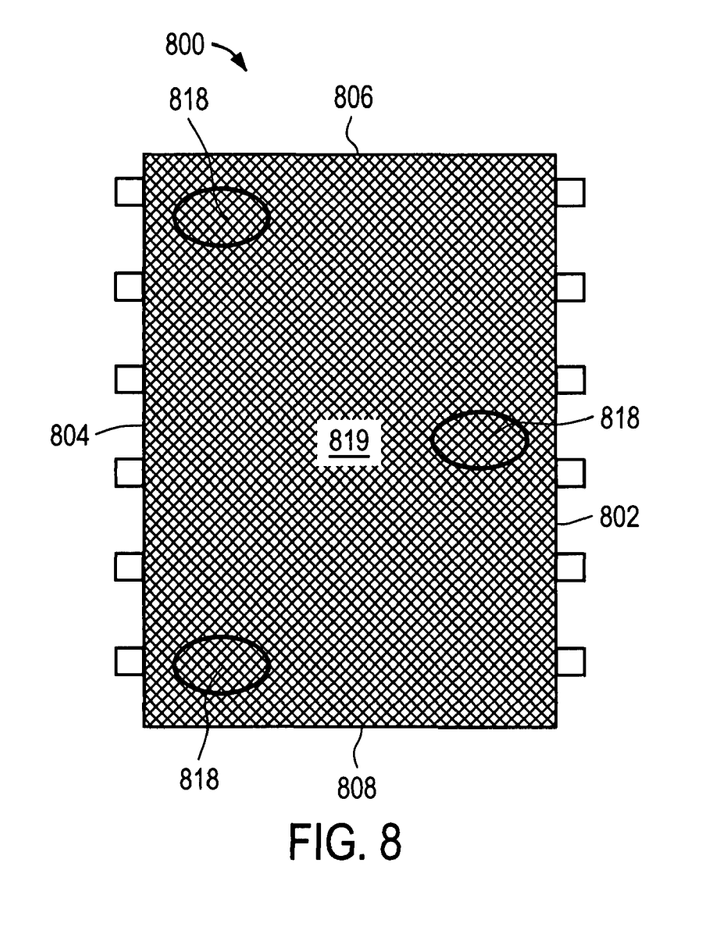
FIG. 8 illustrates a bottom view of yet another example power semiconductor package.

FIG. 8 illustrates a bottom view of yet another example power semiconductor package 800 wherein a plurality of protrusions 818 include a plurality of corresponding elliptically-shaped, substantially flat bases 820 arranged on bottom surface 819 in a triangular pattern. In this embodiment, two protrusions are located near opposite ends of a lateral side 804, with a single protrusion located on bottom surface 819 near the middle of lateral side 802. As is the case for any of the other embodiments described, bases 820 of protrusions 818 may be of an elliptical, triangular, linear, or any other shape.

Figure 9:
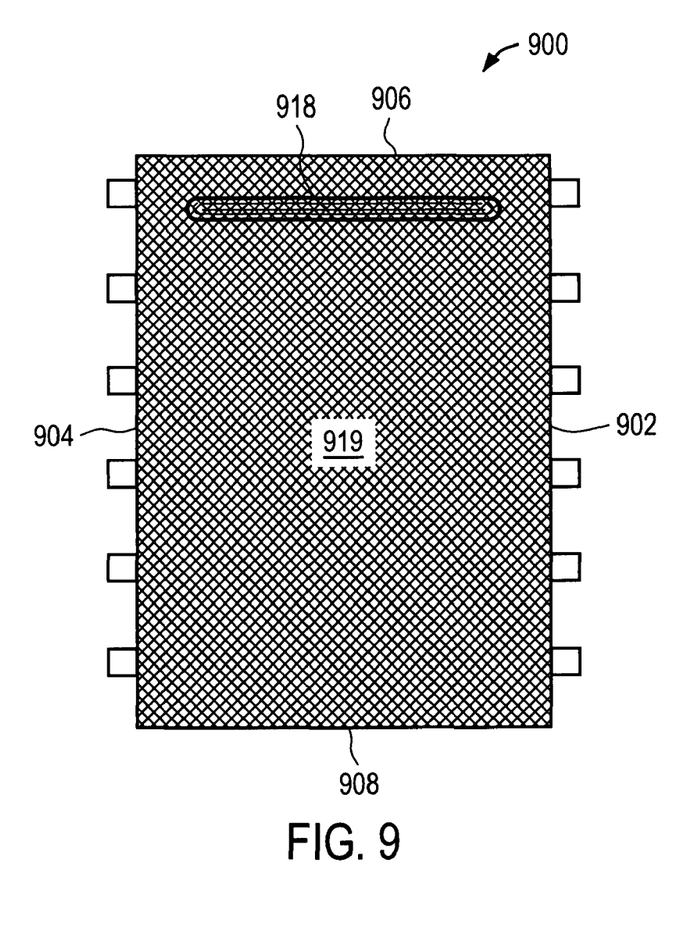
FIG. 9 illustrates a bottom view of still another example power semiconductor package

By way of further example, FIG. 9 shows still another example power semiconductor package 900 that includes a single protrusion 918 having an extended linear shape. Protrusion 918 is disposed on bottom surface 919 near a front side 906 of package 900. Because this embodiment includes only a single protrusion 918, bottom surface 919 will lie at an angle or incline in relation to the surface of the PCB after assembly. In other words, when mounted on a PCB protrusion 918 and the edge of bottom surface 919 that adjoins back side 908 will be in contact with the PCB. In this manner, a varying separation distance between bottom surface 919 and the top surface of the PCB is provided.

Although the present invention has been described in conjunction with specific embodiments, those of ordinary skill in the art will appreciate that numerous modifications and alterations are well within the scope of the present invention. Accordingly, the specification and drawings are to be regarded in an illustrative rather than a restrictive sense.

We claim:

1. A package for housing a power semiconductor device comprising:

a body that encapsulates the power semiconductor device, the body having a first pair of opposing lateral sides, front and back sides, a top that provides a mounting surface for a heat sink, and a bottom surface, a single elongated protrusion disposed substantially coincident with an edge of the bottom surface, the single elongated protrusion extending outward from the bottom surface such that when the package is mounted to a printed circuit board (PCB) the one or more non-conductive protrusions contact the PCB and the bottom surface lies at an angle or incline in relation to the surface of the PCB after assembly; and a plurality of leads that extend outward from at least the first pair of opposing lateral sides, each of the leads having a substantially constant width over a length that extends from the body to a point through an insertion hole of the PCB when the package is mounted to the PCB.

2. The package of claim 1 wherein the single elongated protrusion is disposed substantially coincident with an edge of the bottom surface.

3. The package of claim 1 wherein the single elongated protrusion is substantially linear.

4. The package of claim 1 wherein single elongated protrusion has a substantially flat base.

5. The package of claim 1 wherein the body is rectilinear and the single elongated protrusion extends substantially across a length of a first lateral side between first and second corners of the body.

6. The package of claim 1 wherein each of the leads is separated from an adjacent one of the leads by a second distance that is substantially constant over the length.

7. The package of claim 1 wherein the body comprises a material, the single elongated protrusion being integral with the material.

8. The package of claim 1 wherein a force applied to a heat sink during mounting to the top is substantially transferred to the single elongated protrusions when the package is mounted to the PCB.

* * * * *